United States Patent
Chang et al.

(10) Patent No.: US 10,511,313 B1
(45) Date of Patent: Dec. 17, 2019

(54) PHASE-DETECTING METHOD AND CIRCUIT FOR TESTING A DELAY LOCKED LOOP/DELAY LINE

(71) Applicants: Goke Taiwan Research Laboratory Ltd., Taipei (TW); XINSHENG INTELLIGENT TECHNOLOGY CO., LTD., Jiangsu (CN)

(72) Inventors: Po-Chien Chang, Taipei (TW); Jung-Chi Wang, Zhubei (TW)

(73) Assignees: Goke Taiwan Research Laboratory Ltd., Taipei (TW); Xinsheng Intelligent Technology Co., Ltd., Jiangsu (CN)

( * ) Notice: Subject to any disclaimer, the term of this patent is extended or adjusted under 35 U.S.C. 154(b) by 0 days.

(21) Appl. No.: 16/291,069

(22) Filed: Mar. 4, 2019

(51) Int. Cl.
*H03L 7/093* (2006.01)
*H03L 7/081* (2006.01)
*H03L 7/08* (2006.01)

(52) U.S. Cl.
CPC .......... *H03L 7/0812* (2013.01); *H03L 7/0805* (2013.01); *H03L 7/093* (2013.01)

(58) Field of Classification Search
CPC .................................................... H03L 7/0812
USPC ................................ 327/147–149, 156–158
See application file for complete search history.

(56) References Cited

U.S. PATENT DOCUMENTS

| | | | | |
|---|---|---|---|---|
| 6,060,922 A * | 5/2000 | Chow | ...................... | H03K 5/04 327/175 |
| 6,897,693 B2 * | 5/2005 | Kim | ...................... | G11C 7/22 327/158 |
| 7,551,012 B2 * | 6/2009 | Mai | ...................... | H03L 7/0891 327/158 |
| 7,805,122 B2 * | 9/2010 | Lerner | ................... | H03B 21/00 327/156 |
| 7,809,338 B2 * | 10/2010 | Tsfati | ..................... | H03B 19/00 327/156 |
| 7,904,045 B2 * | 3/2011 | Aoki | ..................... | H03L 7/0812 327/156 |
| 2008/0238489 A1 * | 10/2008 | Sanduleanu | ............ | H03L 7/087 327/42 |
| 2009/0096536 A1 * | 4/2009 | Ortler | ...................... | H03L 7/23 331/25 |
| 2011/0122977 A1 * | 5/2011 | Ludwig | ................ | H03D 13/007 375/346 |
| 2011/0254599 A1 * | 10/2011 | Dikshit | ..................... | H03L 3/00 327/156 |
| 2012/0086484 A1 * | 4/2012 | Trivedi | ................. | H03L 7/0816 327/158 |
| 2013/0099836 A1 * | 4/2013 | Shaeffer | ............. | G01C 19/5776 327/148 |

(Continued)

*Primary Examiner* — Adam D Houston
(74) *Attorney, Agent, or Firm* — Alan D. Kamrath; Mayer & Williams PC

(57) ABSTRACT

A phase-detecting method for testing an under-test circuit under control of a testing station includes the steps of receiving input and output signals of the under-test circuit, combining the input and output signals with each other and accordingly generating a frequency-doubled signal, comparing the frequency-doubled signal with a reference clock signal at a same clock rate and accordingly generating a difference signal, filtering the difference signal and accordingly generating a filtered signal, and determining whether the filtered signal is in an acceptable range and accordingly report a result to the testing station.

8 Claims, 5 Drawing Sheets

(56) References Cited

U.S. PATENT DOCUMENTS

2013/0300475 A1* 11/2013 Kurd ................... H03L 7/22
   327/158
2019/0115925 A1* 4/2019 Shu ................ H03L 7/0814

* cited by examiner

PHASE-DETECTING METHOD AND CIRCUIT FOR TESTING A DELAY LOCKED LOOP/DELAY LINE

BACKGROUND OF INVENTION

1. Field of Invention

The present invention relates to a delay locked loop/delay line and, more particularly, to a phase-detecting method and circuit for testing a delay locked loop/delay line in operation with efficiency and precision.

2. Related Prior Art

Routing of semiconductor devices is getting smaller and more complicated at an astonishing pace so that new types of flaws occur in deep micron and nanometer designs. Mere development and use of functional vectors are no longer enough for testing semiconductor devices. More types of tests must be run on semiconductor devices to ensure satisfactory quality. Comprehensive tests are run on semiconductor devices after the semiconductor devices are manufactured to ensure satisfactory yields of the manufacturing of the semiconductor devices.

For example, a delay locked loop/delay line ("DLL/DL") is a circuit for providing expected phase-shifted signals. A controller includes a DLL/DL to receive a DQS from a DRAM or NAND flash, and shifts the DQS. Then, based on the shifted DQS, the controller samples DQ from the DRAM or NAND flash.

However, there has not been any comprehensive method for testing a semiconductor device in operation. At the present, an optimal testing method can only determine whether a clock rate or frequency of an output signal is identical to that of an input signal but cannot determine whether a phase shift between the input and output signals is 90 degrees.

That is, the optimal testing method can only determine whether a DLL/DL generates an output signal at a clock rate or frequency but cannot be used to determine whether the phase of the output signal is shifted for 90 degrees from the input signal. However, it is a critical function of a DLL/DL to provide phase shifts. It would be impossible to determine whether a DLL/DL functions normally if phase shifts cannot be measured.

Therefore, the present invention is intended to obviate or at least alleviate the problems encountered in prior art.

SUMMARY OF INVENTION

It is the primary objective of the present invention to provide a phase-testing method for determining whether a phase shift between input and output signals of a DLL/DL is 90 degrees, thereby determining whether the DLL/DL is operated normally.

To achieve the foregoing objective, the phase-detecting method for testing an under-test circuit under control of a testing station includes the steps of receiving input and output signals of the under-test circuit, combining the input and output signals with each other and accordingly generating a frequency-doubled signal, comparing the frequency-doubled signal with a reference clock signal at a same clock rate and accordingly generating a differential signal, filtering the differential signal and accordingly generating a filtered signal, and determining whether the filtered signal is in an acceptable range and accordingly report a result to the testing station.

Other objectives, advantages and features of the present invention will be apparent from the following description referring to the attached drawings.

BRIEF DESCRIPTION OF DRAWINGS

The present invention will be described via detailed illustration of the preferred embodiment referring to the drawings wherein.

DETAILED DESCRIPTION OF PREFERRED EMBODIMENT

Figure 1:
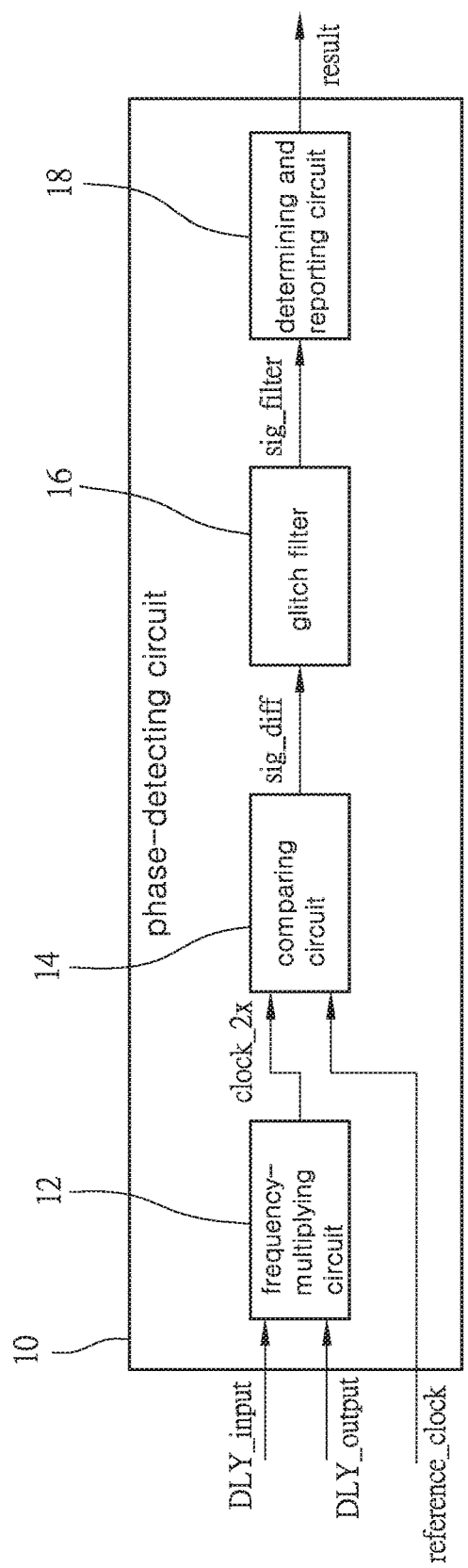
FIG. 1 is a block diagram of a phase-detecting circuit according to the preferred embodiment of the present invention.
Figure 2:
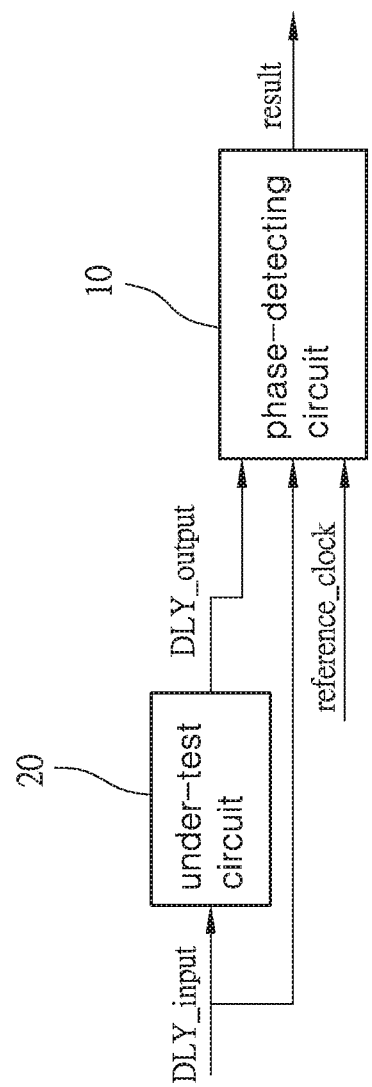
FIG. 2 is a block diagram of an under-test circuit connected to the phase-detecting circuit shown in FIG. 1.

Referring to FIG. 1, there is shown a phase-detecting circuit 10 according to the preferred embodiment of the present invention. Referring to FIG. 2, there is shown an under-test circuit 20 such as a DLL/DL. The phase-detecting circuit 10 is used to test the under-test circuit 20. The phase-detecting circuit 10 includes a frequency-multiplying circuit 12, a comparing circuit 14, a glitch filter 16 and a determining and reporting circuit 18.

The under-test circuit 20 includes an input and an output. The input of the under-test circuit 20 is connected to a DLY signal source (not shown).

The frequency-multiplying circuit 12 includes two inputs and an output. The first input of the frequency-multiplying circuit 12 is connected to the input of the under-test circuit 20 in parallel. The second input of the frequency-multiplying circuit 12 is connected to the output of the under-test circuit 20.

The comparing circuit 14 includes two inputs and an output. The first input of the comparing circuit 14 is connected to the output of the frequency-multiplying circuit 12. The second input of the comparing circuit is connected to a reference clock (not shown).

The glitch filter 16 includes an input and an output. The input of the glitch filter 16 is connected to the comparing circuit 14.

The determining and reporting circuit 18 includes an input and an output. The input of the determining and reporting circuit 18 is connected to the output of the glitch filter 16. The output of the determining and reporting circuit 18 is connected to a testing station (not shown).

Figure 3:
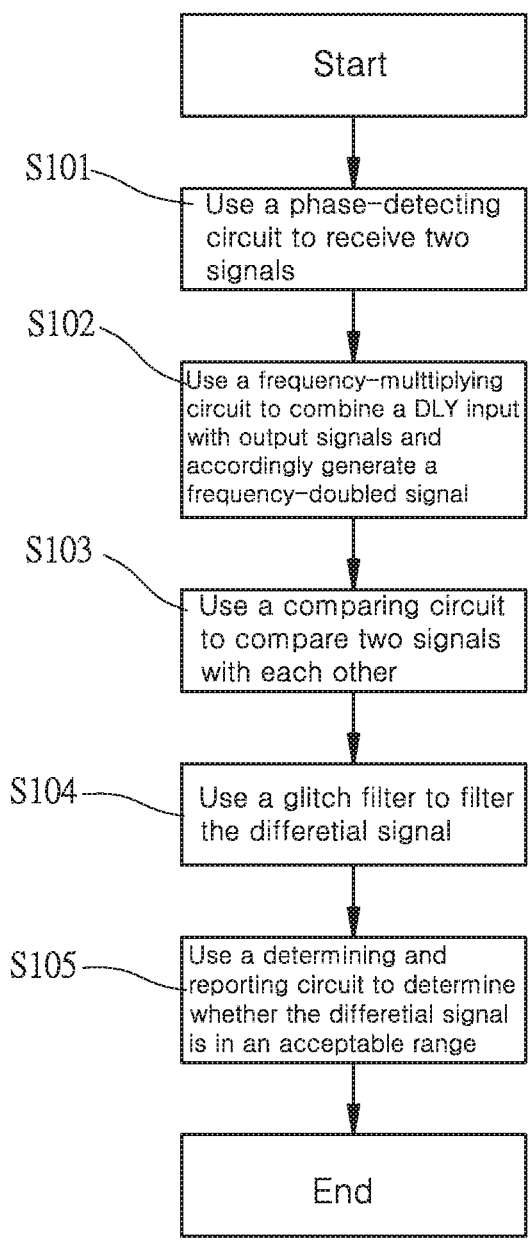
FIG. 3 is a flow chart of a phase-detecting method according to the preferred embodiment of the present invention.

Referring to FIG. 3, there is shown a phase-detecting method according to the preferred embodiment of the present invention. The phase-detecting circuit 10 of FIG. 1 tests the under-test circuit 20 of FIG. 2 according to the phase-detecting method of FIG. 3. In operation, the under-test circuit 20 receives a DLY input signal from the DLY signal source and transmits a DLY output signal. The under-test circuit 20 generates a phase shift 90 degrees between the phase of the DLY input signal and that of the DLY output signal.

At S101, the phase-detecting circuit 10 receives two signals. In detail, the frequency-multiplying circuit 12 receives the DLY input signal from the DLY signal source as the first input of the frequency-multiplying circuit 12 is connected to the input of the under-test circuit 20 in parallel. The frequency-multiplying circuit 12 receives the DLY output signal from the under-test circuit 20 as the second input of the frequency-multiplying circuit 12 is connected to the output of the under-test circuit 20. The terms, "DLY input signal" and "DLY output signal", are given regarding the under-test circuit 20; however, both of them are input signals for the frequency-multiplying circuit 12.

Then, at S102, the frequency-multiplying circuit 12 combines the DLY input and output signals with each other, and accordingly generates a frequency-doubled signal (clock_2x). A frequency-doubled signal is generated if the phase shift is 90 degrees as a result of normal operation of the under-test circuit 20. The phase of the frequency-doubled signal is close to that of the DLY input signal. The phase and duty of the frequency-doubled signal are close to that of the reference clock signal if the phase shift is 90 degrees.

Then, at S103, the comparing circuit 14 compares two signals. In detail, the comparing circuit 14 receives the frequency-doubled signal from the frequency-multiplying circuit 12 as the first input of the comparing circuit 14 is connected to the output of the frequency-multiplying circuit 12. The comparing circuit 14 receives a reference clock signal ("reference_clock") from the reference clock since the second input of the comparing circuit 14 is connected to the reference clock. The clock rate or frequency of the reference clock signal is identical to that of the frequency-doubled signal. Then, the comparing circuit 14 compares the frequency-doubled signal with the reference clock signal, and generates a difference signal (sig_diff) according to the comparison of the frequency-doubled signal with the reference clock signal.

Then, at S104, the glitch filter 16 filters the difference signal. In detail, the glitch filter 16 receives the sig_diff from the comparing circuit 14 because the input of the glitch filter 16 is connected to the output of the comparing circuit 14. The glitch filter 16 is expected to remove glitches from the sig_diff and accordingly provide a filtered signal (sig_filtered).

Figure 4:
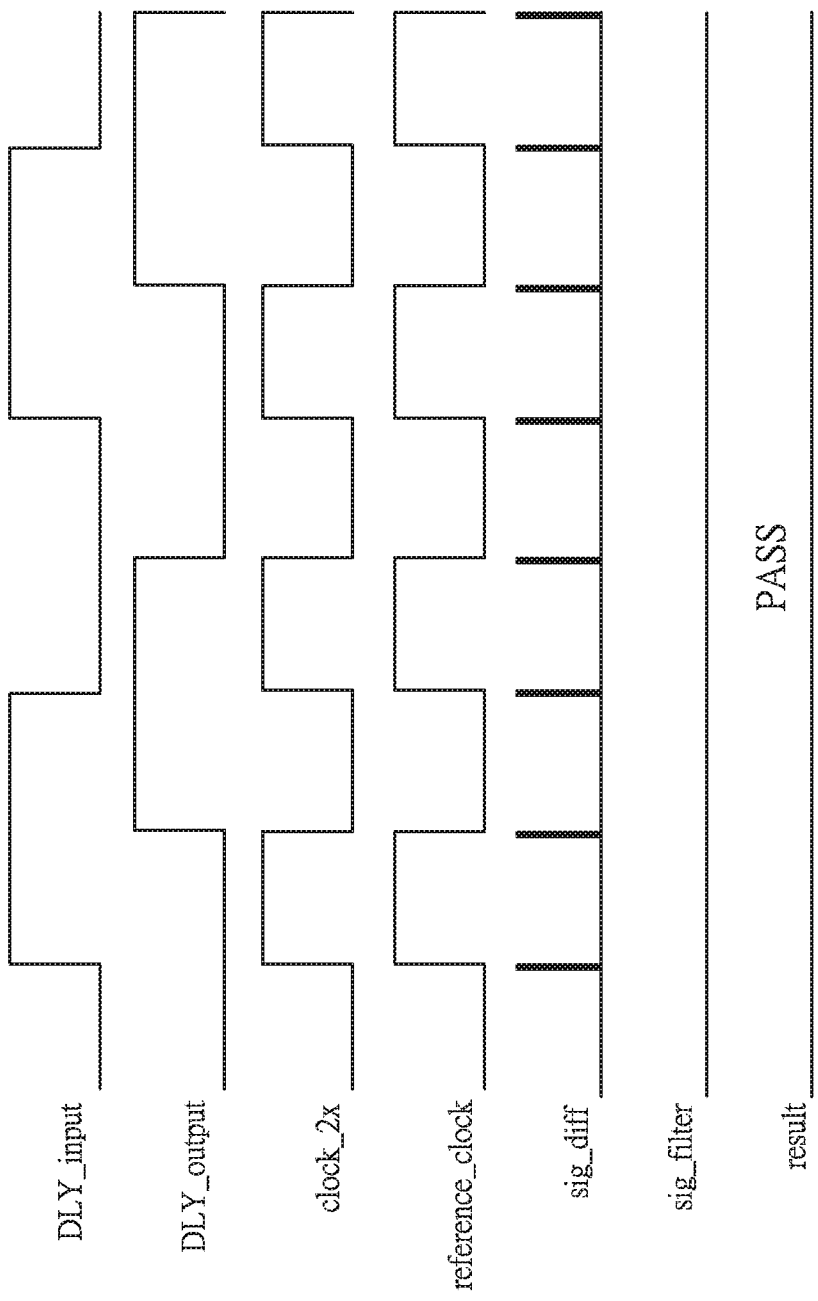
FIG. 4 is a timing diagram in a qualified state.

Referring to FIG. 4, if the phase shift is about 90 degrees, the frequency-doubled signal is substantially identical to the reference clock signal. Accordingly, the signal glitch from sig_diff is very small so that the filtered signal (sig_filtered) is free of glitch.

Figure 5:
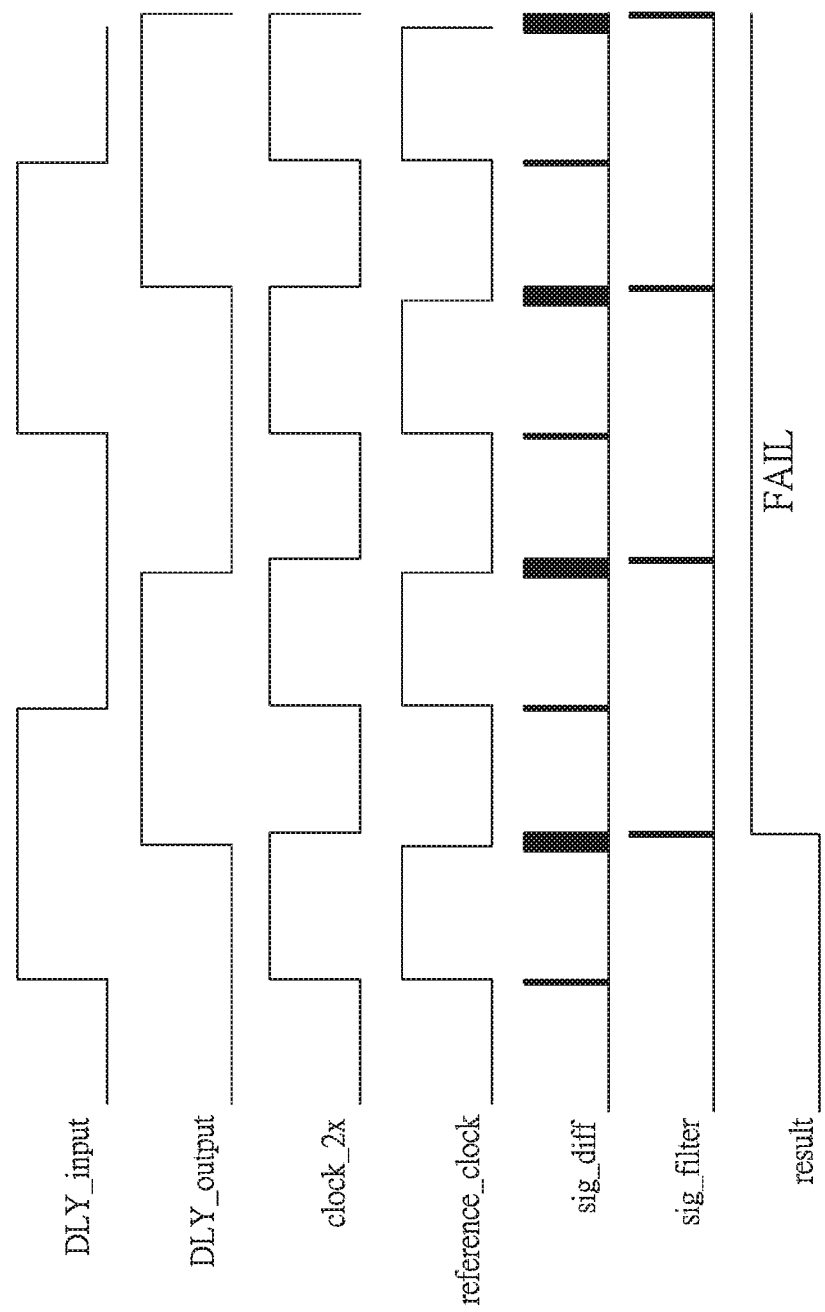
FIG. 5 is a timing diagram in a disqualified state.

Referring to FIG. 5, if the phase shift is not 90 degrees (less or over 90 degrees), the frequency-doubled signal is considerably different from the reference clock signal. Accordingly, the sig_diff is considerably large so that the sig_filtered includes glitches.

Then, at S105, the determining and reporting circuit 18 determines whether the sig_diff is in an acceptable range. In detail, the determining and reporting circuit 18 receives the sig_filter from the glitch filter 16 because the input of the determining and reporting circuit 18 is connected to the output of the glitch filter 16. Then, the determining and reporting circuit 18 determines whether the filtered signal includes glitches. The determining and reporting circuit 18 determines the result of the testing to be qualified if the filtered signal is free of glitch. The determining and reporting circuit 18 determines the result to be disqualified if the filtered signal includes glitches. Then, the determining and reporting circuit 18 reports the result to the testing station.

As discussed above, the phase-detecting circuit 10 generates the frequency-doubled signal based on the DLY_input and DLY_output signals, which are at the same clock rate or frequency but different phases. The frequency-doubled signal is compared with the reference clock signal, which is at the same clock rate or frequency and phase with the frequency-doubled signal. The sig_diff is filtered. Then, it is determined whether the sig_diff is in an acceptable range. The phase shift is determined to be 90 degrees if the sig_diff is in the acceptable range. The operation of the under-test circuit 20 is determined to be qualified if the phase shift is determined to be 90 degrees. Advantageously, with efficiency and precision, the phase-detecting method and circuit determine whether the operation of the under-test circuit 20 is qualified.

The present invention has been described via the illustration of the preferred embodiment. Those skilled in the art can derive variations from the preferred embodiment without departing from the scope of the present invention. Therefore, the preferred embodiment shall not limit the scope of the present invention defined in the claims.

The invention claimed is:

1. A phase-detecting circuit for testing an under-test circuit (20) of a semiconductor device under control of a testing station, the phase-detecting circuit comprising:
   a frequency-multiplying circuit (12) comprising:
      a first input connected to an input of the under-test circuit (20) in parallel to receive an input signal of the under-test circuit (20); and
      a second input connected to an output of the under-test circuit (20) to receive an output signal of the under-test circuit (20) with a phase shift from the input signal of the under-test circuit (20);
      wherein the frequency-multiplying circuit (12) combines the input and output signals of the under-test circuit (20) with each other, and accordingly generates a frequency-doubled signal;
   a comparing circuit (14) comprising:
      a first input connected to an output of the frequency-multiplying circuit (12) to receive a frequency-doubled signal; and
      a second input connected to a reference signal source to receive a reference clock signal;
      wherein the comparing circuit (14) compares the frequency-doubled signal with the reference clock signal and accordingly generates a difference signal, wherein the clock frequency of the reference signal is twice as much as that of the input signal of the under-test circuit (20) and the phase of the reference signal is close to that of the input signal of the under-test circuit (20);
   a glitch filter (16) comprising an input connected to an output of the comparing circuit (14) to receive the difference signal between the reference clock and the frequency-doubled signal, wherein the glitch filter (16) filters the difference signal, and accordingly generates a filtered signal;
   a determining and reporting circuit (18) comprising an input connected to an output of the glitch filter (16) to receive the filtered signal, wherein the determining and reporting circuit (18) determines whether the filtered signal is in an acceptable range, and accordingly reports a result to the testing station.

2. The phase-detecting circuit according to claim 1, wherein the semiconductor is a dynamic random access memory.

3. The phase-detecting circuit according to claim 1, wherein the semiconductor device is a flash memory.

4. The phase-detecting circuit according to claim 1, wherein the under-test circuit (20) is a delay-locked loop.

5. The phase-detecting circuit according to claim 1, wherein the under-test circuit (20) is a delay line.

6. The phase-detecting circuit according to claim 1, wherein the frequency-multiplying circuit (12) generates a frequency-doubled signal with a phase close to the phase of the input signal of the under-test circuit (20) if the phase shift is 90 degrees.

7. A phase-detecting method for testing an under-test circuit (20) of a semiconductor device under control of a testing station, the phase-detecting method comprising the steps of:
   receiving input and output signals of the under-test circuit (20);
   combining the input and output signals of the under-test circuit (20) with each other and accordingly generating a frequency-doubled signal;
   comparing the frequency-doubled signal with a reference clock signal at a same clock rate and accordingly generating a difference signal;
   filtering the difference signal and accordingly generating a filtered signal; and
   determining whether the filtered signal is in an acceptable range and accordingly report a result to the testing station.

8. The phase-detecting method according to claim 7, wherein the phase and duty of the frequency-doubled signal are close to that of the input signal of the under-test circuit (20) if the phase shift is 90 degrees.

\* \* \* \* \*